(12) United States Patent
Wei et al.

(10) Patent No.: US 10,686,005 B2
(45) Date of Patent: *Jun. 16, 2020

(54) SEMICONDUCTOR STRUCTURE

(71) Applicant: TAIWAN SEMICONDUCTOR MANUFACTURING COMPANY LTD., Hsinchu (TW)

(72) Inventors: Chia-Yu Wei, Tainan (TW);
Chin-Hsun Hsiao, Kaohsiung (TW);
Yi-Hsing Chu, Tainan (TW);
Yen-Liang Lin, Tainan (TW);
Yung-Lung Hsu, Tainan (TW);
Hsin-Chi Chen, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/263,750

(22) Filed: Jan. 31, 2019

(65) Prior Publication Data

US 2019/0165011 A1 May 30, 2019

Related U.S. Application Data

(60) Continuation of application No. 16/003,161, filed on Jun. 8, 2018, now Pat. No. 10,204,956, which is a
(Continued)

(51) Int. Cl.
*H01L 27/146* (2006.01)
(52) U.S. Cl.
CPC .... *H01L 27/1464* (2013.01); *H01L 27/14621* (2013.01); *H01L 27/14636* (2013.01); *H01L 27/14685* (2013.01); *H01L 27/14687* (2013.01)

(58) Field of Classification Search
None
See application file for complete search history.

(56) References Cited

U.S. PATENT DOCUMENTS 8,664,736 B2  3/2014  Tsai et al.
8,748,305 B2  6/2014  Chen
(Continued)

FOREIGN PATENT DOCUMENTS

JP  2001-015549  9/2001
JP  2011-109055  6/2011
(Continued)

OTHER PUBLICATIONS

Office Action and Search Report dated Feb. 19, 2019 issued by Japan Patent Office for counterpart application 2017-177623.
(Continued)

*Primary Examiner* — Ali Naraghi
(74) *Attorney, Agent, or Firm* — WPAT, P.C., Intellectual Property Attorneys; Anthony King

(57) ABSTRACT

A semiconductor structure includes a semiconductive substrate including a first side and a second side opposite to the first side, a radiation sensing device disposed in the semiconductive substrate, and an ILD disposed over the first side of the semiconductive substrate, and a conductive pad disposed within the semiconductive substrate and the ILD, and electrically connected to an interconnect structure. A top surface of the conductive pad is between the first side of the semiconductive substrate and the second side of the semiconductor substrate.

20 Claims, 13 Drawing Sheets

Related U.S. Application Data continuation of application No. 15/649,529, filed on Jul. 13, 2017, now Pat. No. 10,177,189, which is a division of application No. 14/642,344, filed on Mar. 9, 2015, now Pat. No. 9,748,301.

(60) Provisional application No. 62/101,597, filed on Jan. 9, 2015.

(56) References Cited

U.S. PATENT DOCUMENTS

| | | |
|---|---|---|
| 9,224,879 B2 | 12/2015 | Kameshima |
| 9,263,490 B2 | 2/2016 | Yanagita et al. |
| 9,324,744 B2 | 4/2016 | Shimotsusa |
| 2011/0109113 A1 | 5/2011 | Masada et al. |
| 2011/0186951 A1* | 8/2011 | Pyo ............... H01L 23/481 257/432 |
| 2012/0086092 A1* | 4/2012 | Yanagita ......... H01L 27/14636 257/432 |
| 2012/0217498 A1 | 8/2012 | Yamanaka et al. |
| 2013/0249033 A1 | 9/2013 | Kim et al. |
| 2014/0077320 A1 | 3/2014 | Chen et al. |
| 2014/0225215 A1 | 8/2014 | Chien et al. |
| 2014/0263958 A1 | 9/2014 | Her et al. |
| 2015/0129978 A1* | 5/2015 | Moon ............. H01L 27/0296 257/394 |

FOREIGN PATENT DOCUMENTS

| | | |
|---|---|---|
| JP | 2012084609 | 4/2012 |
| JP | 2012-244177 | 12/2012 |
| JP | 2013-38391 | 2/2013 |
| JP | 2014-044989 | 3/2014 |
| JP | 2014116615 | 6/2014 |
| JP | 2013-182941 | 3/2015 |
| WO | WO2011027745 | 10/2011 |

OTHER PUBLICATIONS

Office Action and Search Report dated Oct. 15, 2019 issued by Japan Patent Office for counterpart application 2017-177623.
US20120217498 is the counterpart for WO2011027745.
Notice of Allowance dated Mar. 27, 2020 issued by Japan Patent Office for counterpart application No. 2017-177623.
English Abstract Translation of Foreign Reference JP 2013-038391.
English Abstract Translation of Foreign Reference JP 2001-015549.
U.S. Pat. No. 8,664,736 is the English counterpart application to Foreign Reference JP 2012-244177.
U.S. Pat. No. 8,748,305 is the English counterpart application to Foreign Reference JP 2011-109055.
U.S. Pat. No. 9,224,879 is the English counterpart application to Foreign Reference JP 2014-044989.
U.S. Pat. No. 9,324,744 is the English counterpart application to Foreign Reference JP 2013-182941.

* cited by examiner

SEMICONDUCTOR STRUCTURE

PRIORITY CLAIM AND CROSS-REFERENCE

This application claims priority to U.S. patent application Ser. No. 16/003,161, filed on Jun. 8, 2018, entitled of "SEMICONDUCTOR STRUCTURE", which is a continuation of U.S. patent application Ser. No. 15/649,529, filed on Jul. 13, 2017, entitled of "SEMICONDUCTOR STRUCTURE AND MANUFACTURING METHOD THEREOF", which is a divisional of U.S. non-provisional patent application Ser. No. 14/642,344 filed on Mar. 9, 2015 and entitled "Semiconductor Structure and Manufacturing Method Thereof", which claims the benefit of U.S. provisional application Ser. No. 62/101,597 filed on Jan. 9, 2015, the disclosure of which is hereby incorporated by reference in its entirety.

BACKGROUND

Electronic equipment using semiconductor devices are essential for many modern applications. Semiconductor image sensors are commonly involved in electronic equipment for sensing light. Complementary metal-oxide-semiconductor (CMOS) image sensors (CIS) are widely used in various applications, such as digital camera and mobile phone cameras. The CMOS image sensor typically includes an array of picture elements (pixels). Each pixel includes a photo-diode, a transistor or a capacitor. An electrical energy is induced in the photo-diode upon exposure to the light. Each pixel generates electrons proportional to an amount of light falling on the pixel. The electrons are converted into a voltage signal in the pixel and further transformed into digital signal.

The CMOS image sensors are classified as front side illuminated (FSI) image sensors and back side illuminated (BSI) image sensors, depending on the light path difference. The BSI image sensors are gaining in popularity. The pixels in the BSI image sensor generate electrical signals in response to incident light. Magnitudes of the electrical signals depend on the intensity of the incident light received by the respective pixels. The light is incident on a back side of a substrate of the BSI image sensor and hits the photo-diode directly, without obstruction from dielectric layers and interconnect layers formed on a front side of the substrate. Such a direct incidence makes the BSI image sensor more sensitive to the light.

However, as technologies evolve, the image sensor is becoming increasingly smaller in size while having greater functionality and greater amounts of integrated circuitry. The manufacturing of the BSI image sensor involves many complicated steps and operations. Since more different components with different materials are involved, complexity of the manufacturing and integration operations of the BSI image sensor is increased. An increase in a complexity of manufacturing of the BSI image sensor may cause deficiencies such as poor quantum efficiency (QE), strip line defect, dark current, low full well capacity (FWC), high yield loss etc. The BSI image sensor is produced in an undesired configuration, which would further exacerbate materials wastage and increase the manufacturing cost.

Therefore, there is a continuous need to improve a structure and a manufacturing method for of the BSI image sensor device in order to improve the performance of the BSI image sensor device as well as reduce cost and time on processing the BSI image sensor.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
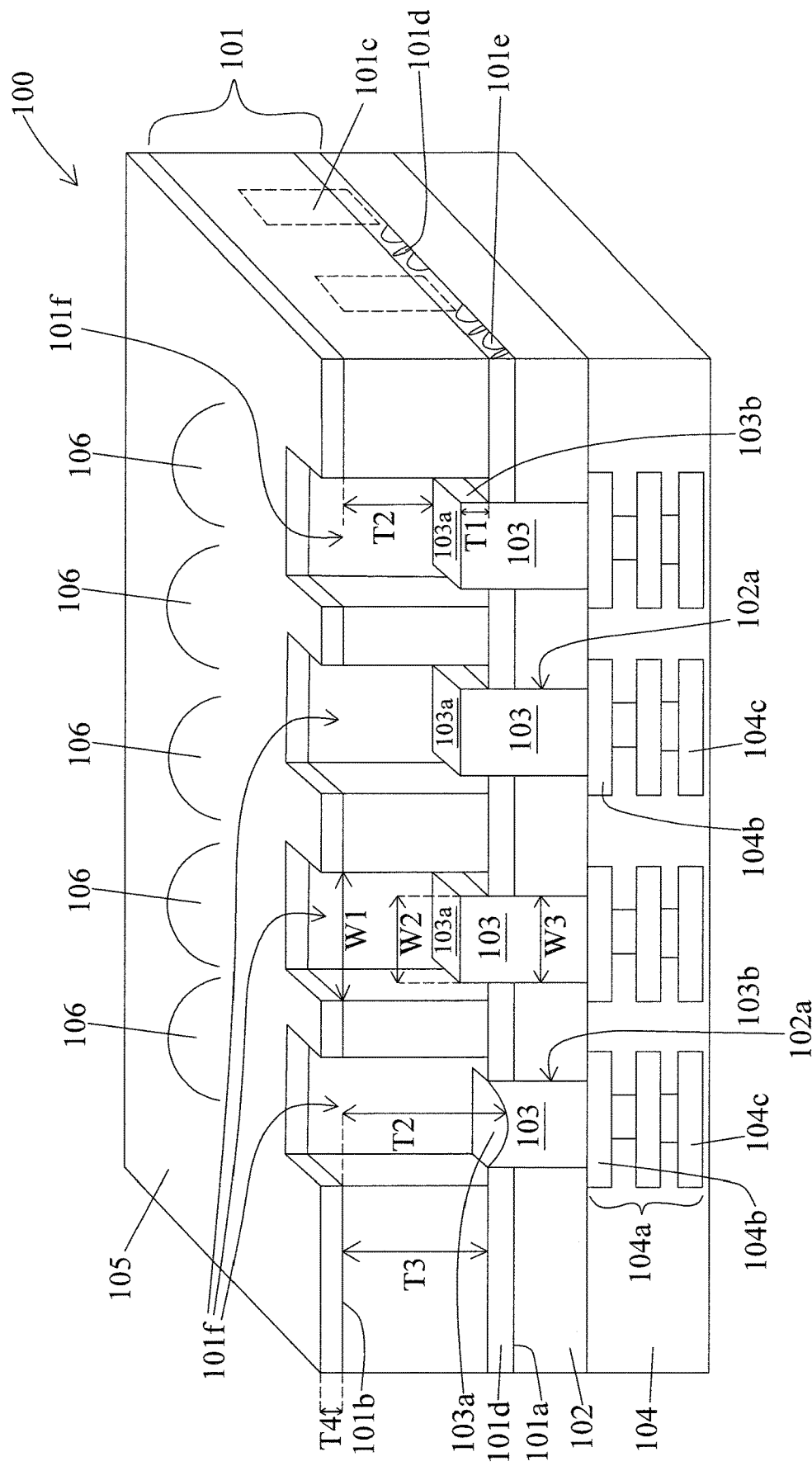
FIG. 1 is a perspective view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A back side illuminated (BSI) image sensing device is manufactured by a number of operations. During the manufacturing, a substrate of the device is fabricated for sensing electromagnetic radiation projected into the device. The substrate is configured to receive a light incident from a back side of the substrate. The incident light hits a radiation sensing device in the substrate directly, and an intensity of the incident light is detected. Besides the intensity, a color or wavelength of the incident light is obtained by color filters. The color filters are disposed over the back side of the substrate by spin coating operations.

In the BSI device, an interlayer dielectric (ILD) and an intermetallic dielectric (IMD) are disposed over the front side of the substrate. An interconnect structure in the IMD is electrically connected to a bond pad passing through the ILD and disposed in the substrate. During manufacturing of the BSI device, the substrate covering and surrounding the bond pad (the substrate in a bond pad region) is removed to expose the bond pad from the substrate for subsequent electrical connection. The substrate in the bond pad region and the substrate in a scribe line region are etched away from the back side of the substrate. A rough and uneven surface of the substrate over the back side is resulted. The rough surface degrades ability to spin coat the color filters thereon. The color filters would be blocked by the substrate and thus cannot be smoothly spread over the back side of the substrate. The color filters cannot be disposed uniformly over the back side of the substrate, resulting in a color signal deviation (referred as strip defect). As a result, the quantum efficiency (QE) of the BSI device is decreased.

In the present disclosure, an improved semiconductor structure is disclosed. The semiconductor structure includes a semiconductive substrate, an interlayer dielectric (ILD) disposed over a front side of the semiconductive substrate, and a conductive pad passing through the ILD and disposed in the semiconductive substrate. The semiconductive substrate covering the conductive pad is removed, and the conductive pad is surrounded by the semiconductive substrate. Since only the semiconductive substrate covering the conductive pad is removed, an uneven topography of a back side of the semiconductive substrate is mitigated. A roughness of the back side of the semiconductive substrate is decreased.

Therefore, a color filter can be easily spread over the back side of the semiconductive substrate during spin coating operations, and the color filter in a thinner and uniform thickness can be disposed over the back side of the semiconductive substrate. Further, the thinner color filter allows better incident of light to the radiation sensing device in the semiconductive substrate and thus improves the QE of the semiconductor structure. In addition, the thinner color filter can save material cost.

Figure 2:
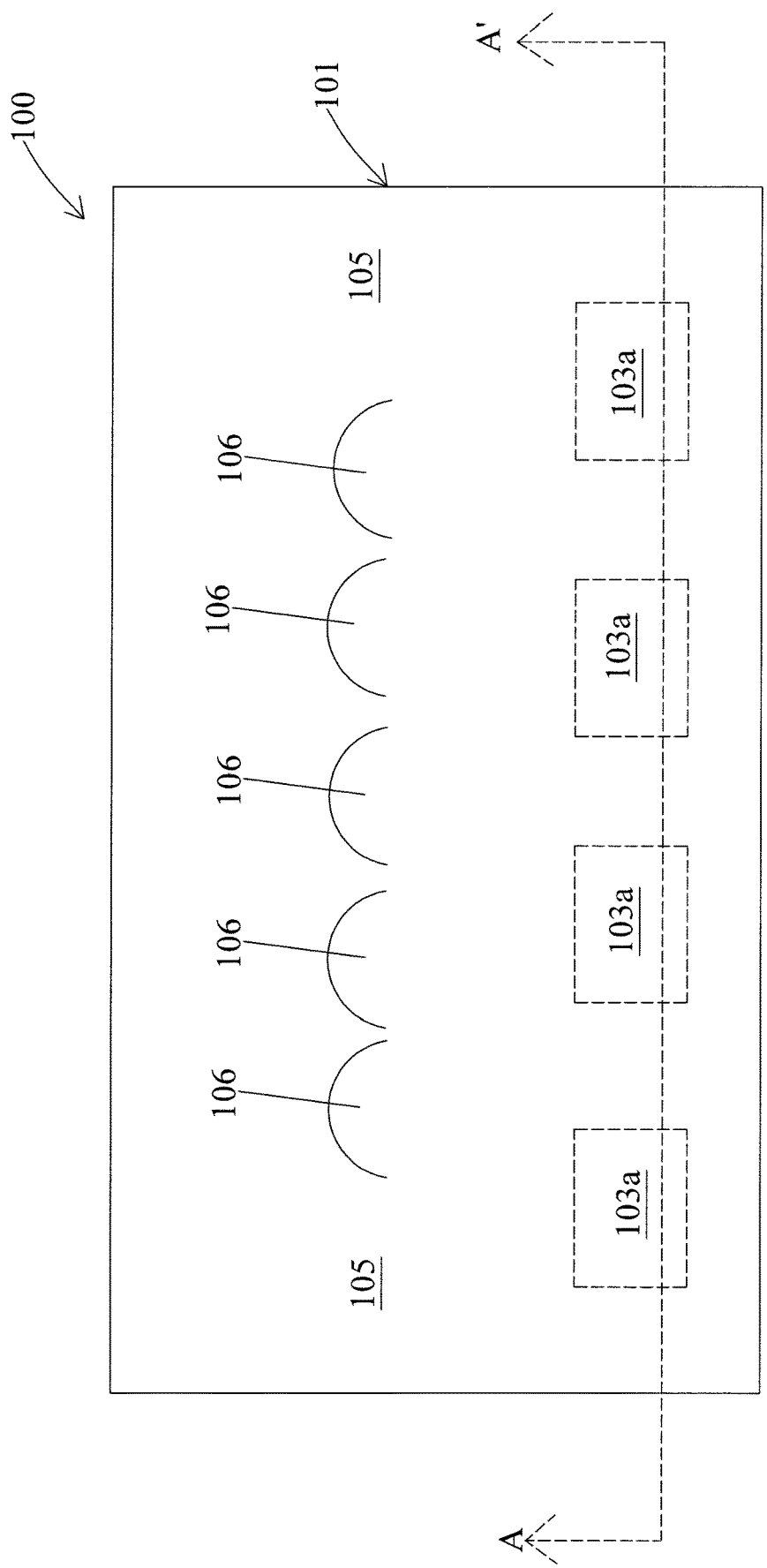
FIG. 2 is a top view of a semiconductor structure of FIG. 1.

FIG. 1 is a perspective view of a semiconductor structure 100 in accordance with some embodiments of the present disclosure. FIG. 2 is a top view of the semiconductor structure 100. FIG. 1 illustrates a cross sectional view of the semiconductor structure 100 along AA' of FIG. 2.

In some embodiments, the semiconductor structure 100 is a semiconductor image sensing device for sensing an electromagnetic radiation entering into the semiconductor structure 100. In some embodiments, the semiconductor structure 100 includes a semiconductive substrate 101, an interlayer dielectric (ILD) 102 and a conductive pad 103.

In some embodiments, the semiconductive substrate 101 is a silicon substrate. In some embodiments, the semiconductive substrate 101 includes silicon, germanium, gallium arsenide or other suitable semiconductive materials. In some embodiments, the semiconductive substrate 101 is in a form of silicon-on-insulator (SOI), silicon-on-sapphire (SOS), doped and undoped semiconductors, epitaxial layers of silicon supported by a base semiconductor foundation, or other semiconductor structures. In some embodiments, the semiconductive substrate 101 is a complementary metal-oxide-semiconductor (CMOS) sensor substrate or an image sensor chip.

In some embodiments, the semiconductive substrate 101 includes a first side 101a and a second side 101b opposite to the first side 101a. In some embodiments, the first side 101a is referred as a front side of the semiconductive substrate 101, and the second side 101b is referred as a back side of the semiconductive substrate 101. In some embodiments, the first side 101a of the semiconductive substrate 101 is configured to electrically connect with circuitries in dielectric layers or conductive traces in a semiconductor package. In some embodiments, the second side 101b of the semiconductive substrate 101 is configured to receive and sense an electromagnetic radiation such as light.

In some embodiments, the semiconductive substrate 101 includes a radiation sensing device 101c. The radiation sensing device 101c is disposed in the semiconductive substrate 101. In some embodiments, the radiation sensing device is arranged in an array manner. In some embodiments, the radiation sensing device 101c is part of an image pixel for detecting an electromagnetic radiation (for example, light etc.) incident from the second side 101b of the substrate 101. In some embodiments, the radiation sensing device 101c is implemented as a photodiode, a photo sensor, a p-n junction or etc. in the semiconductive substrate 101. The electromagnetic radiation incident from the second side 101b induces the radiation sensing device 101c to generate electron-hole pairs in a depletion region of the radiation sensing device 101c.

In some embodiments, a shallow trench isolation (STI) 101d is disposed in the semiconductive substrate 101 and adjacent to the first side 101a of the semiconductive substrate 101 and the radiation sensing device 101c. In some embodiments, the STI 101d includes an oxide or dielectric for isolating the radiation sensing device 101c. In some embodiments, the STI 101d is configured to separate the radiation sensing device 101c. In some embodiments, the STI 101d is arranged in a grid manner. In some embodiments, the STI 101d includes dielectric materials such as silicon oxide, silicon nitride, silicon oxynitride, a low-k material or etc. In some embodiments, the STI 101d has a depth extended from the first side 101a. In some embodiments, the depth of the STI 101d is less than about 2 μm.

In some embodiments, a dopant 101e is doped in the semiconductive substrate 101 adjacent to the first side 101a. In some embodiments, the semiconductive substrate 101 is a p-type substrate doped with a p-type dopant such as boron. In some embodiments, the semiconductive substrate 101 is an n-type substrate doped with an n-type dopant such as phosphorous or arsenic. In some embodiments, the STI 101d is surrounded by the dopant 101e.

In some embodiments, the ILD 102 is disposed over the first side 101a of the semiconductive substrate 101. In some embodiments, the ILD 102 includes a via 102a passing through the ILD 102. In some embodiments, the via 102a is extended from the first side 101a of the semiconductive substrate 101.

In some embodiments, the ILD 102 is in a multilayer structure. In some embodiments, the ILD 102 includes dielectric materials such as silicon dioxide, silicon nitride, silicon oxynitride, TEOS oxide, phosphosilicate glass (PSG), borophosphosilicate glass (BPSG), fluorinated silica glass (FSG), carbon doped silicon oxide, BCB (bis-benzocyclobutenes), polyimide, other suitable materials, or combinations thereof. In some embodiments, a conductive material is disposed in the ILD 102 and electrically connected to the dopant 101e or the radiation sensing device 101c.

In some embodiments, the conductive pad 103 is configured to couple with an interconnect structure 104a in an intermetallic dielectric (IMD) 104. The IMD 104 is disposed over the ILD 102. In some embodiments, the conductive pad 103 passes through the ILD 102 and disposed in the semiconductive substrate 101. In some embodiments, the conductive pad 103 passes through the ILD 102 and the STI 101d of the semiconductive substrate 101. The conductive pad 103 is extended into the semiconductive substrate 101.

In some embodiments, a portion of the conductive pad 103 is surrounded by the substrate 101. In some embodiments, the portion of the conductive pad 103 is protruded from the first side 101a or the STI 101d of the semiconductive substrate 101. In some embodiments, the conductive pad 103 is partially surrounded by the ILD 102 or partially surrounded by the semiconductive substrate 101. In some embodiments, a thickness T1 of the portion of the conductive pad 103 is about 1 µm to about 5 µm. In some embodiments, the thickness T1 is about 2 µm to 2.5 µm.

In some embodiments, a step height T2 is configured by a surface 103a of the portion of the conductive pad 103 and the second side 101b of the semiconductive substrate 101. In some embodiments, the surface 103a of the portion of the conductive pad 103 is disposed at a level substantially different from the second side 101b of the semiconductive substrate 101. In some embodiments, the surface 103a of the conductive pad 103 is disposed at the level substantially lowered than the second side 101b of the semiconductive substrate 101. In some embodiments, the step height T2 between the surface 103a of the conductive pad 103 and the second side 101b of the semiconductive substrate 101 is about 0.5 µm to about 3 µm. In some embodiments, the surface 103a of the conductive pad 103 is a curved surface. In some embodiments, the surface 103a is a concave or convex surface. In some embodiments, the surface 103a is curved towards the first side 101a of the semiconductive substrate 101. As a result, the step height T2 between the curved surface 103a of the conductive pad 103 and the second side 101b of the semiconductive substrate 101 is greater as illustrated in FIG. 1.

In some embodiments, the semiconductive substrate 101 includes a recessed portion 101f extended from the second side 101b towards the first side 101a of the semiconductive substrate 101. In some embodiments, the recessed portion 101f is extended from the second side 101b to the STI 101d of the semiconductive substrate 101. In some embodiments, the portion of the conductive pad 103 is disposed within the recessed portion 101f. In some embodiments, the surface 103a of the conductive pad 103 is disposed within the recessed portion 101f. In some embodiments, a height T3 of the recessed portion 101f is about 1 µm to about 4 µm.

In some embodiments, the substrate 101 is absent from the surface 103a of the conductive pad 103. In some embodiments, a side surface 103b of the conductive pad 103 is disposed away from the semiconductive substrate 101. The side surface 103b is not contacted with the semiconductive substrate 101. In some embodiments, a width W1 of the recessed portion 101f of the semiconductive substrate 101 is substantially greater than or equal to a width W2 of the surface 103a of the conductive pad 103.

In some embodiments, the ILD 102 includes the via 102a for the conductive pad 103 passing through. In some embodiments, a width W3 of the via 102a of the ILD 102 is substantially smaller than or equal to the width W2 of the surface 103a of the portion of the conductive pad 103.

In some embodiments, the semiconductor structure 100 includes the IMD 104 disposed over the ILD 102. In some embodiments, the interconnect structure 104a is disposed in the IMD 104. In some embodiments, the interconnect structure 104a in the IMD 104 includes a metallic member (104b, 104c) electrically connected to the conductive pad 103. In some embodiments, the conductive pad 103 is electrically connected to a first metal 104b and a top metal 104c.

In some embodiments, the semiconductor structure 100 includes a color filter 105 disposed over the second side 101b of the semiconductive substrate 101. In some embodiments, the color filter is configured to filter an electromagnetic radiation in a specific wavelength, such as a visible light, red light, green light, blue light, etc. The electromagnetic radiation is incident from the second side 101b of the semiconductive substrate 101. In some embodiments, the color filter 105 is aligned with the radiation sensing device 101c.

In some embodiments, the color filter 105 includes a dye-based or pigment-based polymer for filtering out the electromagnetic radiation in a specific wavelength or frequency band. In some embodiments, the color filter 105 includes a resin or other organic based material having color pigments. In some embodiments, a thickness T4 of the color filter 105 is about 0.2 µm to about 1.5 µm.

In some embodiments, the semiconductor structure 100 includes a micro lens 106 disposed over the color filter 105. In some embodiments, the micro lens 106 is configured to direct and focus the electromagnetic radiation incident towards the radiation sensing device 101c in the semiconductive substrate 101. In some embodiments, the micro lens 106 is disposed in various arrangements and in various shapes, depending on a refractive index of a material used for the micro lens 106 and a distance from the radiation sensing device 101c.

Figure 3:
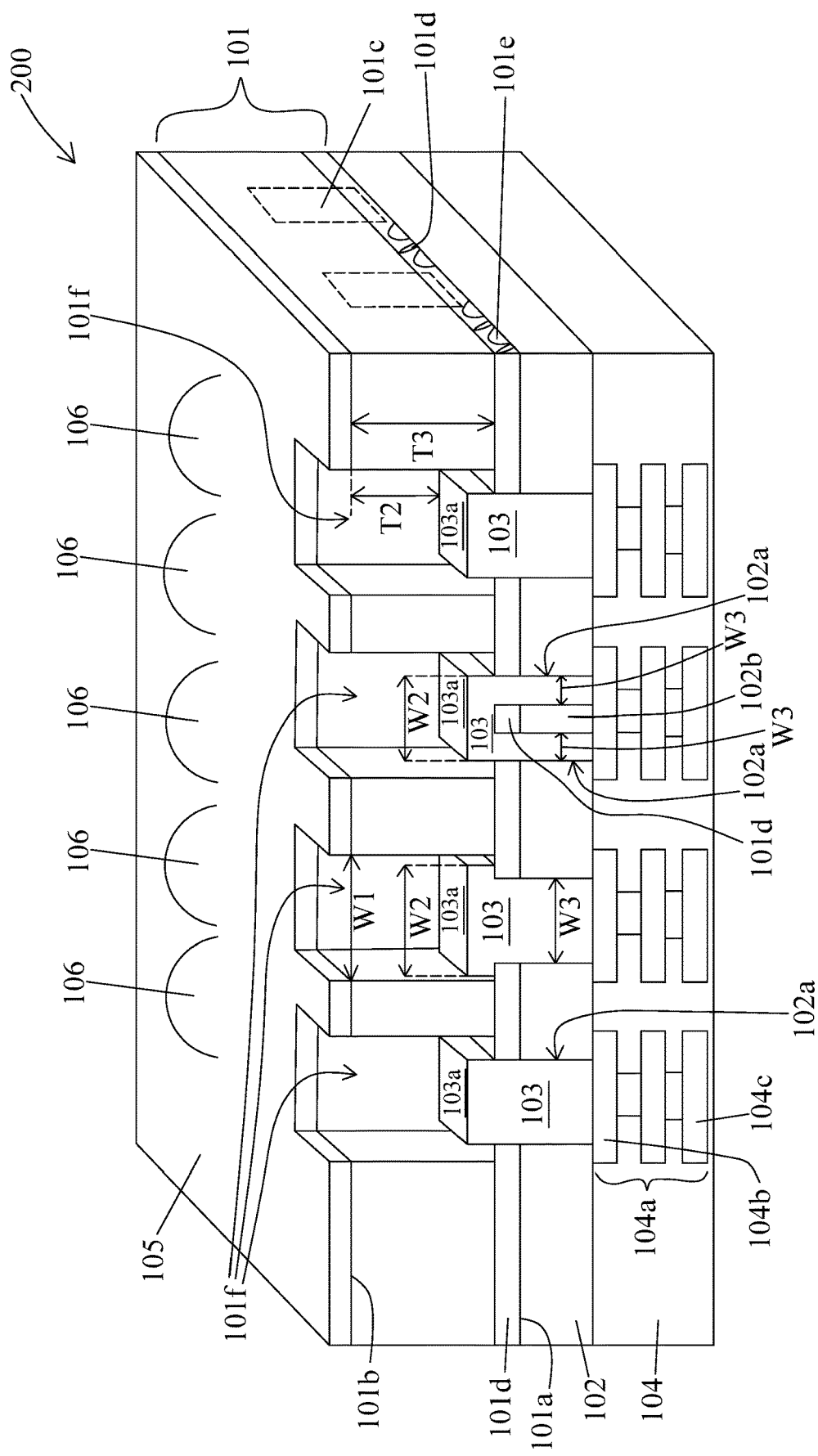
FIG. 3 is a perspective view of a semiconductor structure in accordance with some embodiments of the present disclosure.
Figure 4:
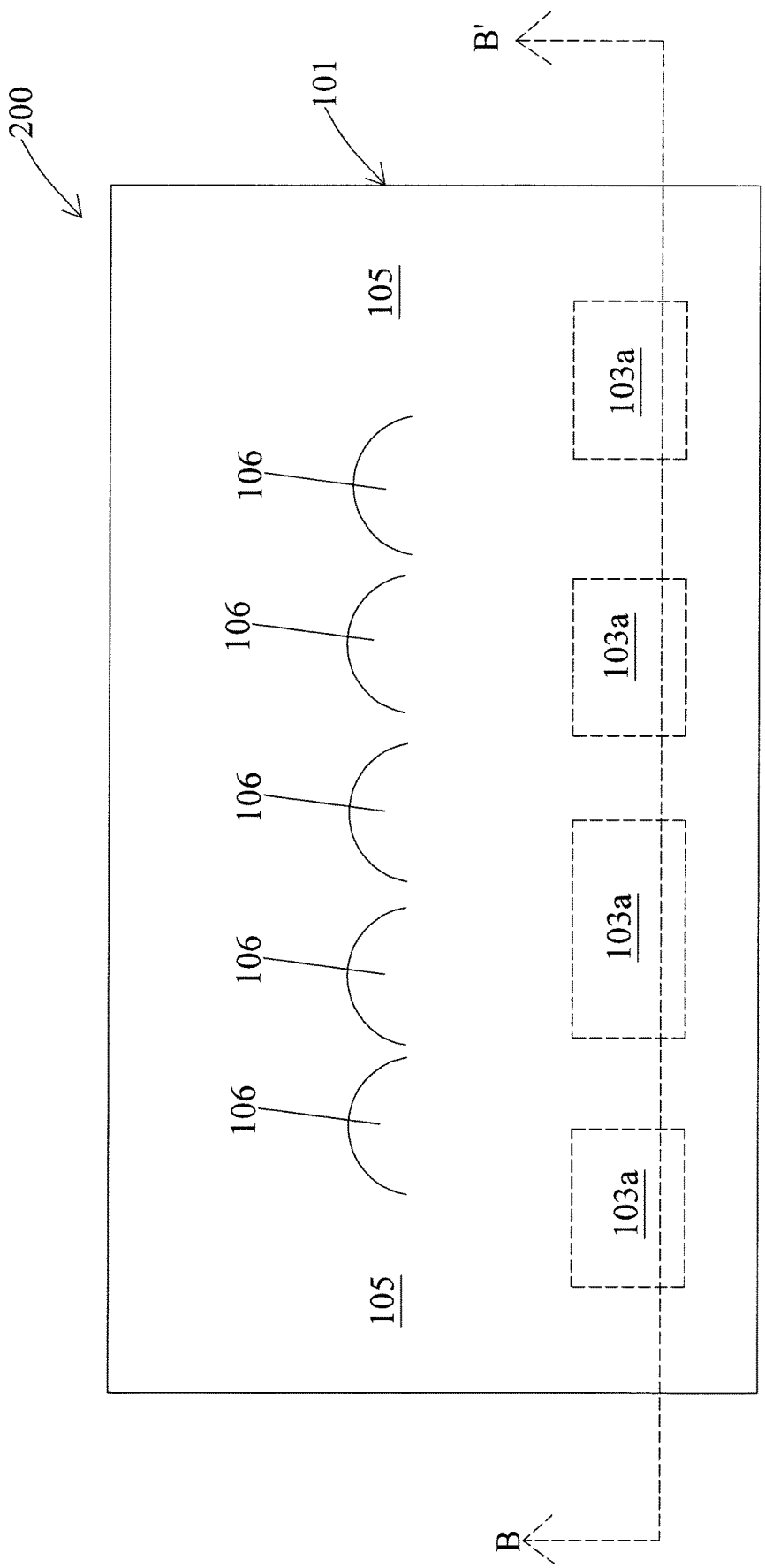
FIG. 4 is a top view of a semiconductor structure of FIG. 3.

FIG. 3 is a perspective view of a semiconductor structure 200 in accordance with some embodiments of the present disclosure. FIG. 4 is a top view of the semiconductor structure 200. FIG. 3 illustrates a cross sectional view of the semiconductor structure 200 along BB' of FIG. 4.

In some embodiments, the semiconductor structure 200 is a semiconductor image sensing device for sensing an electromagnetic radiation incident thereon. In some embodiments, the semiconductor structure 200 includes a semiconductive substrate 101, an interlayer dielectric (ILD) 102, several conductive pads 103 and several recessed portions 101f in the semiconductive substrate 101, which have similar configuration as in the semiconductor structure 100 of FIGS. 1 and 2.

In some embodiments, the semiconductive substrate 101 includes a first side 101a, a second side 101b opposite to the first side 101a and several radiation sensing devices 101c. In some embodiments, the ILD 102 is disposed over the first side 101a of the semiconductive substrate 101. In some embodiments, the recessed portions 101f are disposed in the semiconductive substrate 101. Each of the recessed portions 101f is extended from the second side 101b towards the first side 101a of the semiconductive substrate 101. In some embodiments, the conductive pads 103 are disposed within the recessed portions 101f respectively. In some embodiments, each of the conductive pads 103 passes through the ILD 102. In some embodiments, the conductive pads 103 are electrically connected with interconnect structures 104a in an intermetallic dielectric (IMD) 104 respectively. In some embodiments, several color filters 105 and micro lens 106 are disposed over the second side 101b of the semiconductive substrate 101.

In some embodiments, each of the conductive pads 103 has a surface 103a. The surfaces 103a of the conductive pads 103 are surrounded by the substrate 101. In some embodiments, a step height T2 is configured by one of the surfaces 103a of the conductive pads 103 and the second side 101b of the semiconductive substrate 101. In some embodiments, the surface 103a of the conductive pads 103 are disposed at a level substantially different from the second side 101b of the semiconductive substrate 101. In some embodiments, one or more of the surfaces 103a of the conductive pads 103 is substantially at the level lower than the second side 101b of the semiconductive substrate 101. In some embodiments, the step height T2 between one of the surfaces 103a of the conductive pads 103 and the second side 101b of the semiconductive substrate 101 is about 0.5 μm to about 3 μm.

In some embodiments, portions of the conductive pads 103 are disposed within the recessed portions 101f respectively. In some embodiments, the substrate 101 is absent from the surfaces 103a of the conductive pads 103. In some embodiments, the semiconductive substrate 101 is disposed between the conductive pads 103. The semiconductive substrate 101 is disposed between the adjacent conductive pads 103. In some embodiments, the conductive pads 103 are separated by the semiconductive substrate 101.

In some embodiments, a height T3 of one of the recessed portions 101f of the semiconductive substrate 101 is about 1 μm to about 4 μm. In some embodiments, a width W1 of one of the recessed portions 101f is substantially greater than or equal to a width W2 of one of the surfaces 103a of the conductive pad 103.

In some embodiments, one of the surfaces 103a of the conductive pad 103 has different width W2 from another one of the surfaces 103a of the conductive pad 103. In some embodiments, a width W3 of one of the conductive pads 103 surrounded by the ILD 102 is substantially smaller or equal to the width W2 of one of the surfaces 103a of the conductive pads 103. As shown in FIG. 3, one of the conductive pads 103 has different widths (W2 and W3) along its length extending between the substrate 101 and the ILD 102. In some embodiments, one of the conductive pads 103 is in a T shape.

In some embodiments, a portion 102b of the ILD 102 is disposed within one of the conductive pads 103. In some embodiments, a portion of the semiconductive substrate 101 is disposed within one of the conductive pads 103. In some embodiments, a portion of the STI 101d of the semiconductive substrate 101 is disposed within one of the conductive pads 103. In some embodiments, one of the conductive pads 103 is extended along and disposed within more than one vias 102a of the ILD 102. One of the conductive pads 103 fills more than one vias 102a. In some embodiments, the width W3 of the conductive pad 103 within the via 102a is substantially smaller than the width W2 of the surface 103a of the conductive pad 103.

In the present disclosure, a method of manufacturing a semiconductor structure is also disclosed. In some embodiments, a semiconductor structure is formed by a method 300. The method 300 includes a number of operations and the description and illustration are not deemed as a limitation as the sequence of the operations.

Figure 5:
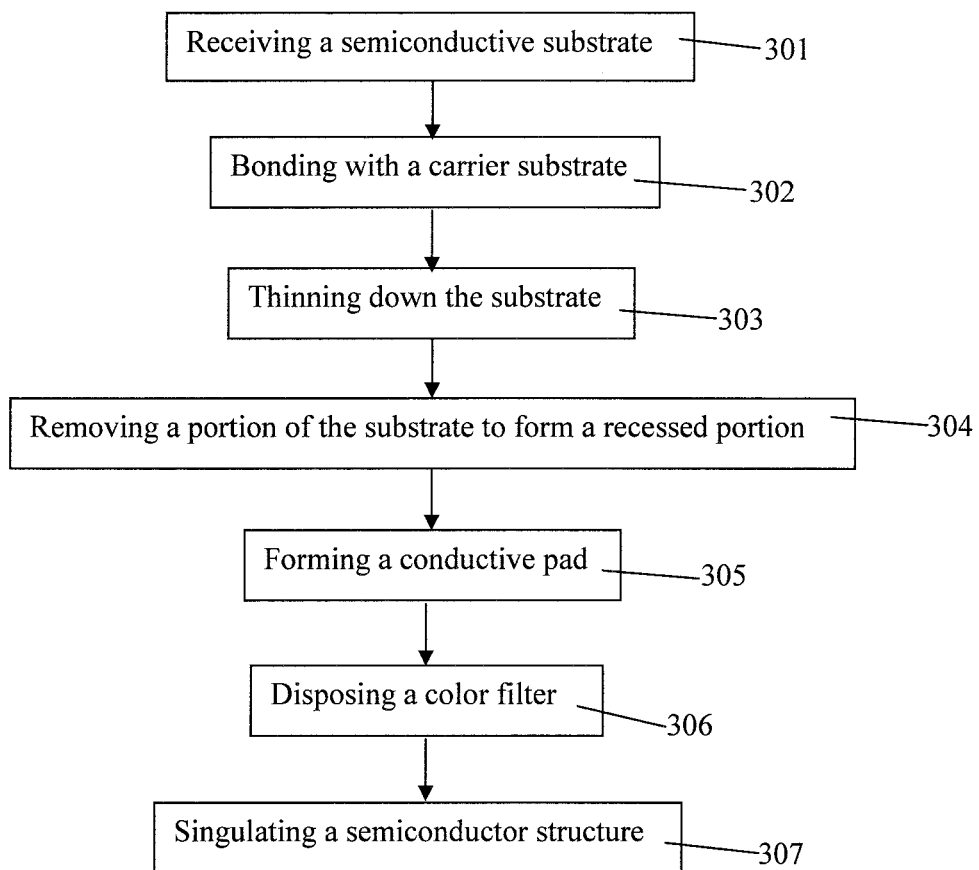
FIG. 5 is a flow diagram of a method of manufacturing a semiconductor structure in accordance with some embodiments of the present disclosure.

FIG. 5 is an embodiment of a method 300 of manufacturing a semiconductor structure. The method 300 includes a number of operations (301, 302, 303, 304, 305, 306 and 307).

Figure 5A:
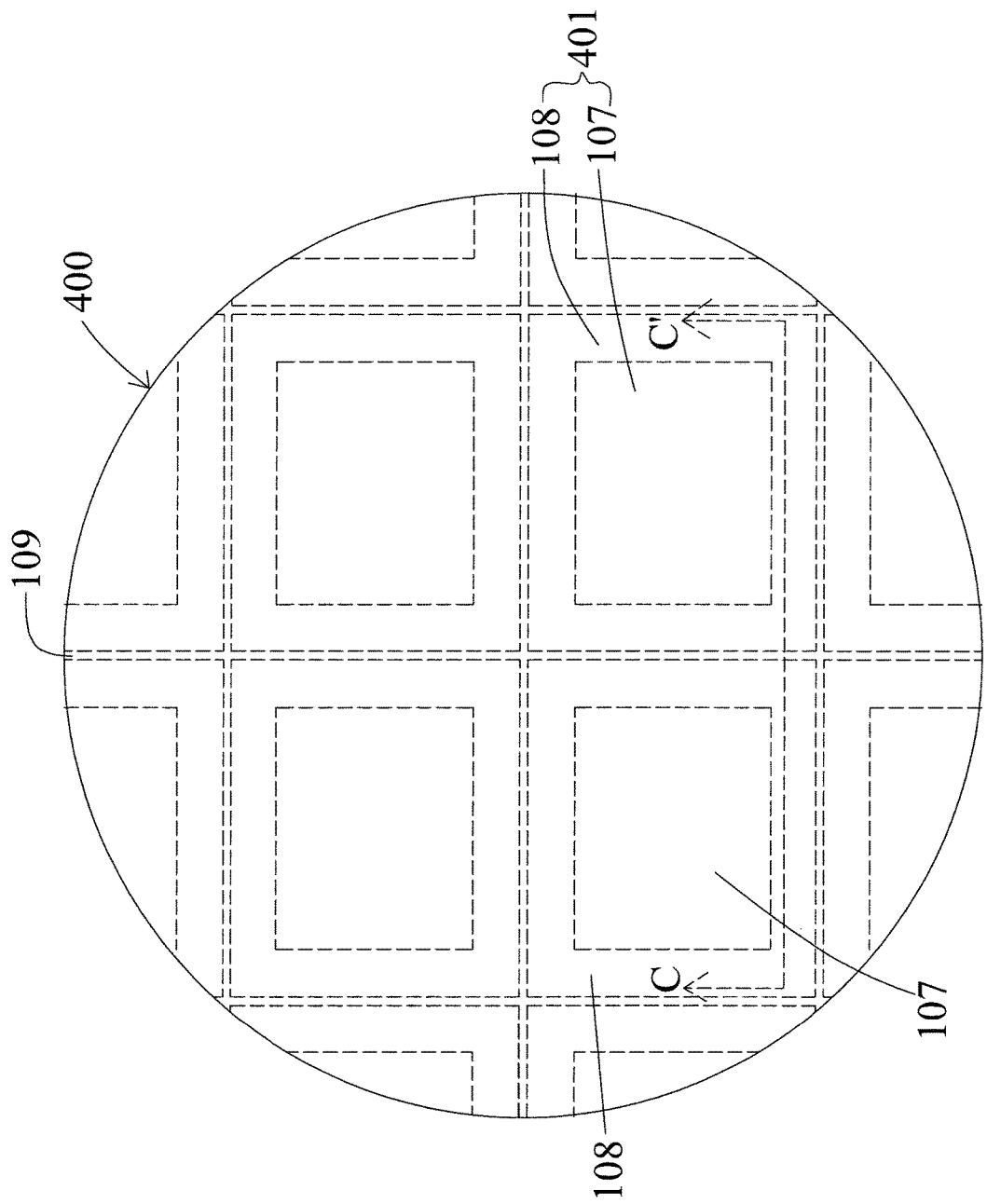
FIG. 5A is a top view of a semiconductive wafer including semiconductive structures in accordance with some embodiments of the present disclosure.
Figure 5B:
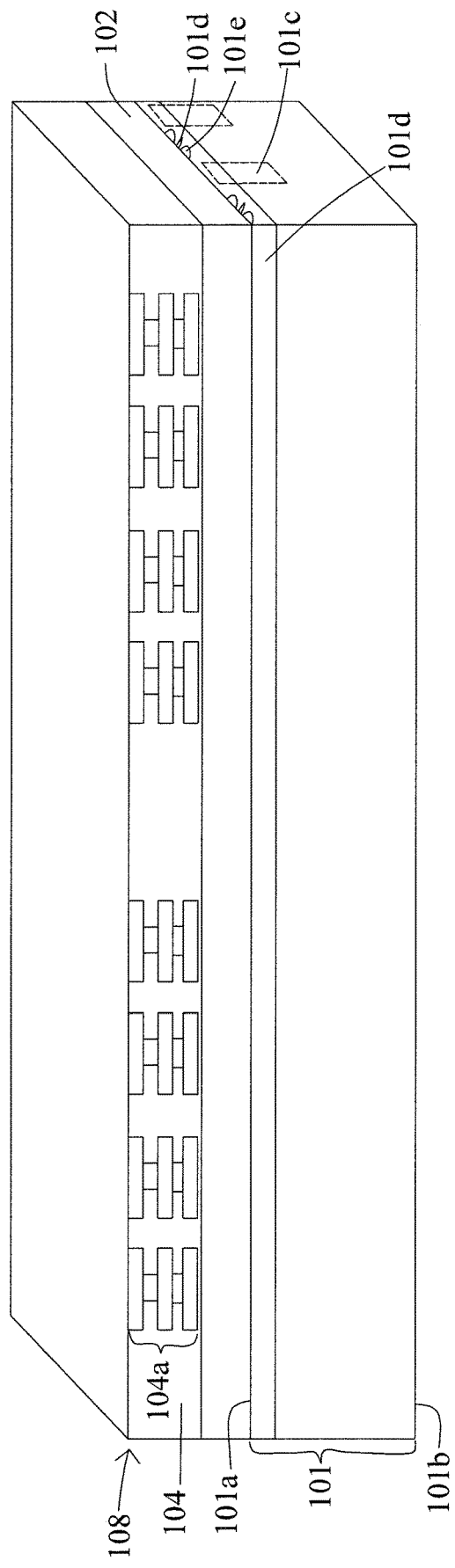
FIG. 5B is a perspective view of adjacent semiconductor structures along CC' of FIG. 5A in accordance with some embodiments of the present disclosure.

In operation 301, a semiconductive substrate 101 is received as shown in FIGS. 5A and 5B. In some embodiments, the semiconductive substrate 101 is a silicon substrate. FIG. 5A is a top view of a semiconductive wafer 400 including the semiconductive substrate 101. FIG. 5B is a cross sectional perspective view of a portion of the semiconductive wafer 400 along CC' of FIG. 5A. In some embodiments, the semiconductive wafer 400 is defined with several device areas 401. The device areas 401 are arranged in an array manner and aligned with each other in rows and columns as shown in FIG. 5A. In some embodiments, the device areas 401 are divided by several scribe line regions 109.

In some embodiments, each device area 401 includes an active region 107 and a pad region 108. In some embodiments, the active region 107 includes active components such as a transistor, a transfer gate, a radiation sensing device 101c or the like disposed thereon. In some embodiments, the pad region 108 is configured to dispose a conductive pad in subsequent operations. In some embodiments, each device area 401 includes the semiconductive substrate 101. In some embodiments, the semiconductive substrate 101 has similar configuration as shown in any one of FIGS. 1-4.

For ease of explanation and simplicity, the following description is only directed to two adjacent device areas 401 along CC' of FIG. 5A. However, it is understood that the operations described below are applicable to whole semiconductive wafer 400 and other device areas 401, without departing from the spirit and scope of the present disclosure. It is not intended to limit to two device areas 401.

In some embodiments, the semiconductive substrate 101 includes a first side 101a and a second side 101b opposite to the first side 101a. In some embodiments, several radiation sensing devices 101c are formed in the semiconductive substrate 101. In some embodiments, a shallow trench isolation (STI) 101d is formed within the substrate 101 and adjacent to the first side 101a. In some embodiments, an interlayer dielectric (ILD) 102 is disposed over the first side 101a of the semiconductive substrate 101. In some embodiments, an intermetallic dielectric (IMD) 104 is disposed over the ILD 102. In some embodiments, an interconnect structure 104a is disposed within the IMD 104. In some embodiments, the STI 101d, the ILD 102, the IMD 104 and the interconnect structure 104a have similar configuration as shown in any one of FIGS. 1-4.

Figure 5C:
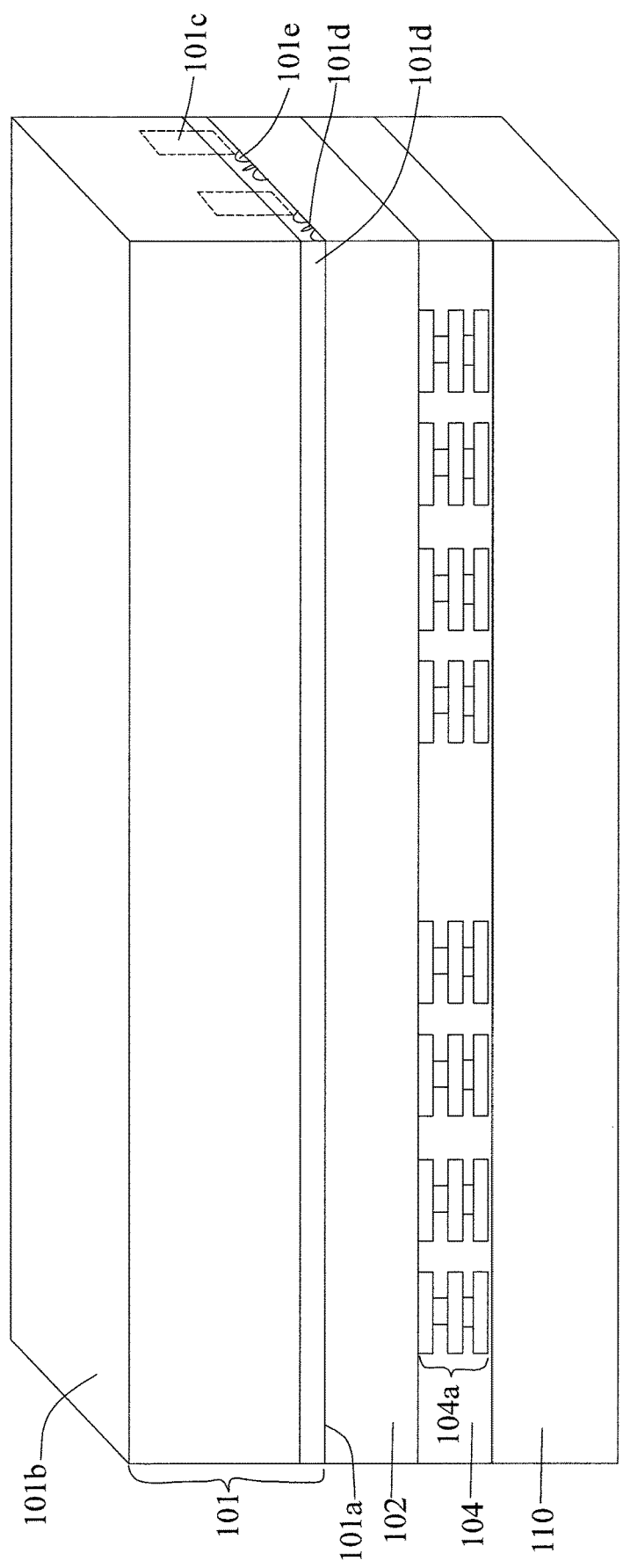
FIG. 5C is a perspective view of adjacent semiconductor structures flipped and disposed on a carrier substrate in accordance with some embodiments of the present disclosure.

In operation 302, a carrier substrate 110 is provided and is bonded with the semiconductive wafer 400 (referring to FIG. 5A) as shown in FIG. 5C. In some embodiments, the semiconductive wafer 400 is flipped that the second side 101b of the semiconductive substrate 101 becomes facing upward as shown in FIG. 5C. In some embodiments, the carrier substrate 110 is disposed over the first side 101a of the semiconductive substrate 101. In some embodiments, the carrier substrate 110 is bonded with the IMD 104. In some embodiments, the carrier substrate 110 is a silicon substrate, a glass substrate or etc.

Figure 5D:
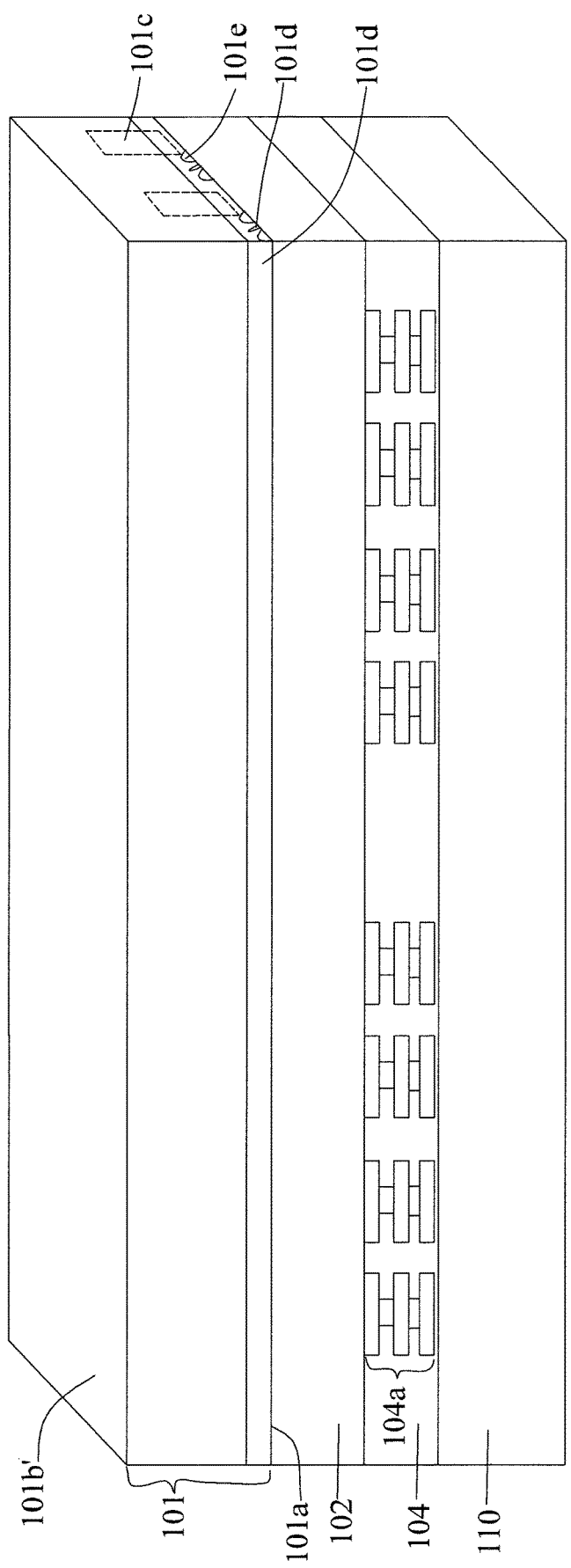
FIG. 5D is a perspective view of adjacent semiconductor structures with a thinned semiconductive substrate in accordance with some embodiments of the present disclosure.

In operation 303, a thickness of the semiconductive substrate 101 is thinned down and decreased as shown in FIG. 5D. In some embodiments, the thickness of the semiconductive substrate 101 is decreased by thinning operations, grinding operations, etching operations or other suitable operations. In some embodiments, the thickness of the semiconductive substrate 101 is decreased by grinding the second side 101b (referring to FIG. 5C) to become a new second side 101b'. The semiconductive substrate 101 is grinded from the second side 101b towards the first side 101a.

Figure 5E:
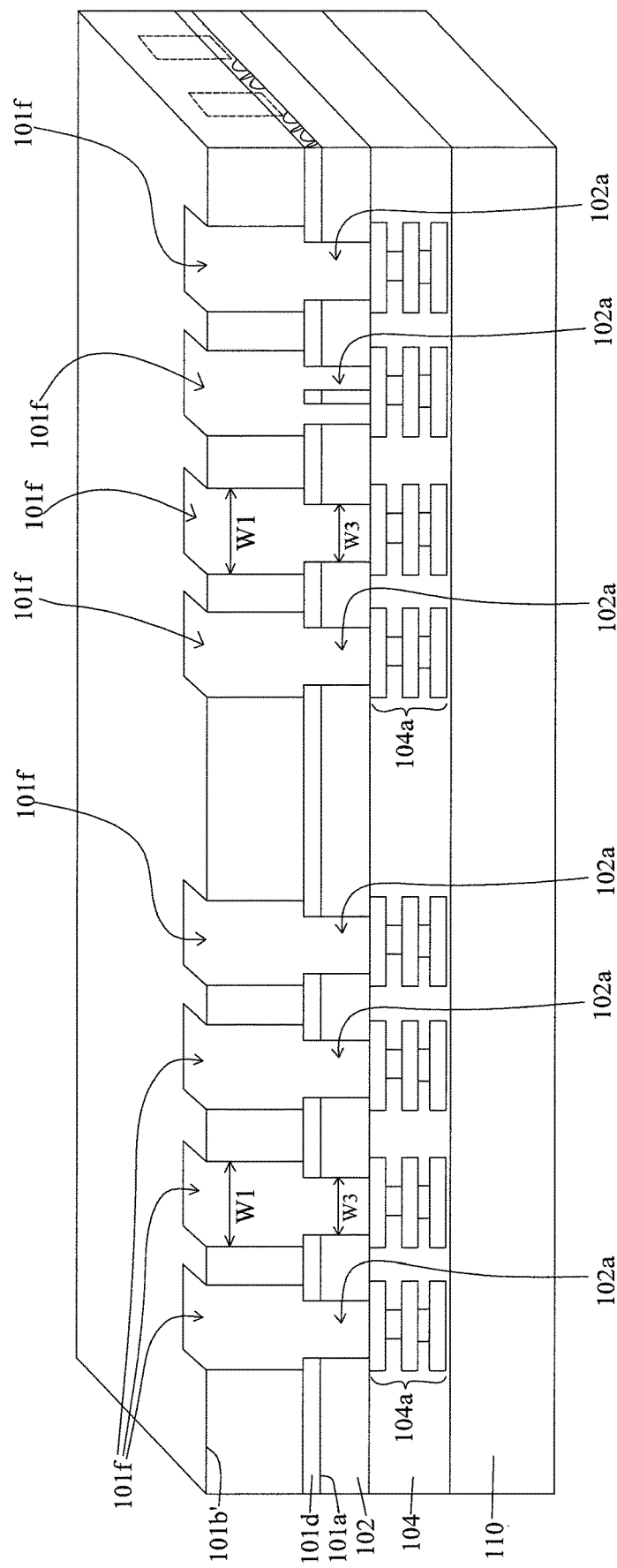
FIG. 5E is a perspective view of adjacent semiconductor structures with several recessed portions in accordance with some embodiments of the present disclosure.

In operation 304, a portion of the semiconductive substrate 101 is removed from the new second side 101b' to form a recessed portion 101f as shown in FIG. 5E. In some embodiments, a portion of the semiconductive substrate 101 and a portion of the ILD 102 are removed from the new second side 101b' to form the recessed portion 101f and the via 102a respectively. In some embodiments, the recessed portion 101f and the via 102a are coupled with each other. In some embodiments, a width W1 of the recessed portion 101f is substantially greater than or equal to a width W3 of the via 102a.

In some embodiments, the removal of the portion of the semiconductive substrate 101 and the removal of the portion of the ILD 102 are performed simultaneously or separately. In some embodiments, the portion of the semiconductive substrate 101 is removed to form the recessed portion 101f, then the portion of the ILD 102 is removed to form the via 102a. In some embodiments, the recessed portion 101f is extended from the new second side 101b' towards the first side 101a of the semiconductive substrate 101.

In some embodiments, the portion of the semiconductive substrate 101 or the portion of the ILD 102 is removed by photolithography operations and etching operations. In some embodiments, a photo mask is disposed over the new second side 101b' of the semiconductive substrate 101, and the photo mask is patterned in accordance with a position of a conductive pad to be disposed. The patterned photo mask is disposed over the new second side 101b', and the portion of the semiconductive substrate 101 is removed by etching operations.

In some embodiments, the photo mask is patterned by disposing a photoresist and developing the photoresist by a suitable developer solution. The pattern according to the position of the conductive pad to be disposed is then developed. The photo mask allows only the portion of the semiconductive substrate 101 at the position of the conductive pad to be removed by the etching operations. As a result, the semiconductive substrate 101 in the position of the conductive pad to be disposed would be etched away and the recessed portion 101f is formed.

Figure 5F:
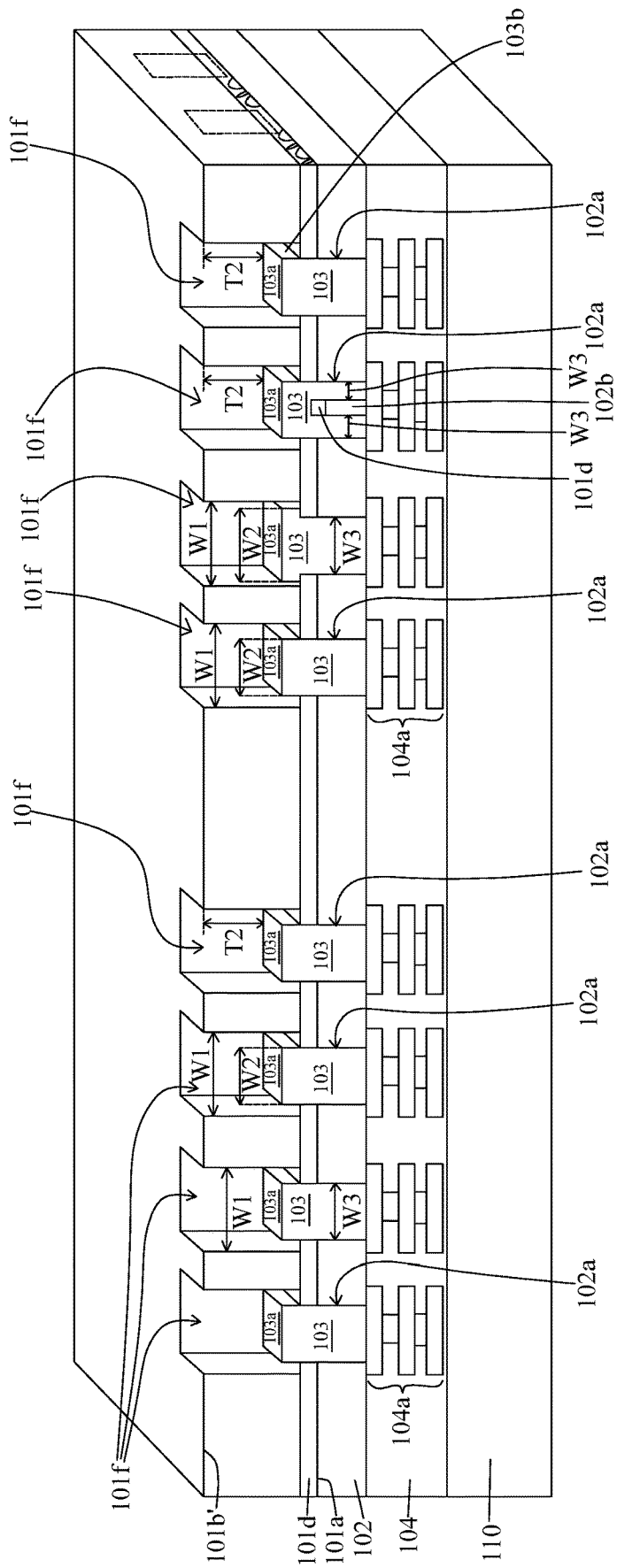
FIG. 5F is a perspective view of adjacent semiconductor structures with several conductive pads disposed within several recessed portions in accordance with some embodiments of the present disclosure.

In operation 305, a conductive pad 103 is formed as shown in FIG. 5F. In some embodiments, the conductive pad 103 is formed and surrounded by the semiconductive substrate 101. In some embodiments, the conductive pad 103 is extended within the ILD and a portion of the conductive pad 103 is surrounded by the semiconductive substrate 101. In some embodiments, the conductive pad 103 includes a surface 103a and a side surface 103b. The surface 103a and the side surface 103b are surrounded by the semiconductive substrate 101. In some embodiments, the surface 103a of the conductive pad 103 is absent from the semiconductive substrate 101. In some embodiments, the surface 103a and the side surface 103b do not contact with the semiconductive substrate 101.

In some embodiments, a step height T2 is configured by the surface 103a of the portion of the conductive pad 103 and the second side 101b of the semiconductive substrate 101. In some embodiments, the surface 103a of the conductive pad 103 is distanced away from the second side 101b of the semiconductive substrate 101. In some embodiments, the surface 103a is at a level substantially lower than the second side 101b.

In some embodiments, the width W1 of the recessed portion 101f is substantially greater than or equal to a width W2 of the surface 103a of the conductive pad 103. In some embodiments, the width W2 of the surface 103a of the conductive pad 103 is substantially greater than or equal to the width W3 of the via 102a. Therefore, the conductive pad 103 has different widths (W2 and W3) along its length.

In some embodiments, the conductive pad 103 fills more than one vias 102a. In some embodiments, a portion of the semiconductive substrate 101 and a portion of the ILD 102 are surrounded by the conductive pad 103. In some embodiments, a portion of the STI 101d of the substrate 101 and the portion of the ILD 102 are surrounded by the conductive pad 103. In some embodiments, the width W3 of the via 102a is substantially smaller than the width W2 of the surface 103a of the conductive pad 103.

Figure 5G:
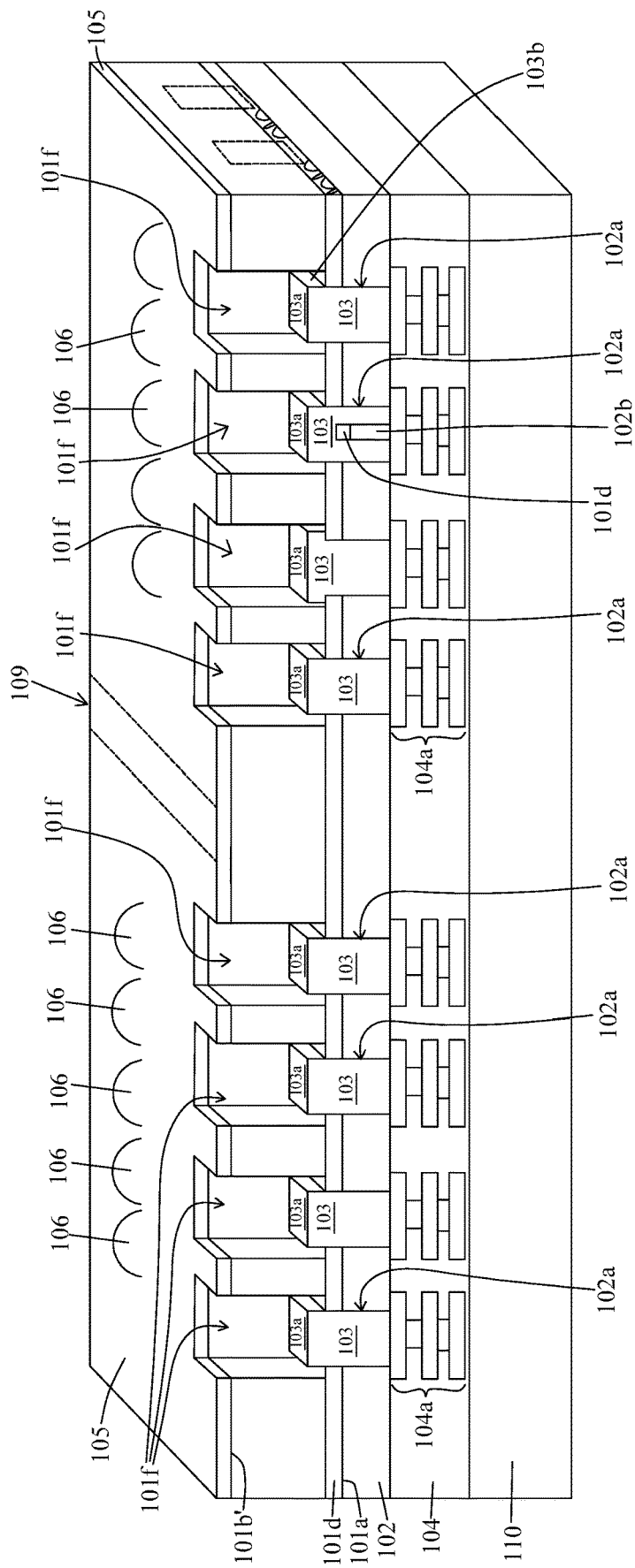
FIG. 5G is a perspective view of adjacent semiconductor structures with several color filters and micro lens in accordance with some embodiments of the present disclosure.

In operation 306, a color filter 105 is disposed over the new second side 101b' of the semiconductive substrate 101 as shown in FIG. 5G. In some embodiments, the color filter 105 is disposed over the new second side 101b' by spin coating operations or any other suitable operations. The color filter 105 is uniformly disposed over the new second side 101b' of the semiconductive substrate 101. In some embodiments, a micro lens 106 is disposed over the color filter 105.

Since only the semiconductive substrate 101 disposed over the conductive pad 103 is removed, the recessed portion 101f does not substantially affect a topography of the new second side 101b' of the semiconductive substrate 101. Therefore, spreading the color filter 105 over the new second side 101b' would not be affected by the topography of the new second side 101b' of the semiconductive substrate 101. The color filter 105 can be uniformly spread over the new second side 101b' during the spin coating operations. In addition, a thin layer of the color filter 105 is disposed over the new second side 101b' by the spin coating operations. The thinner color filter 105 can increase quantum efficiency (QE) of the semiconductor structure to be manufactured.

Figure 5H:
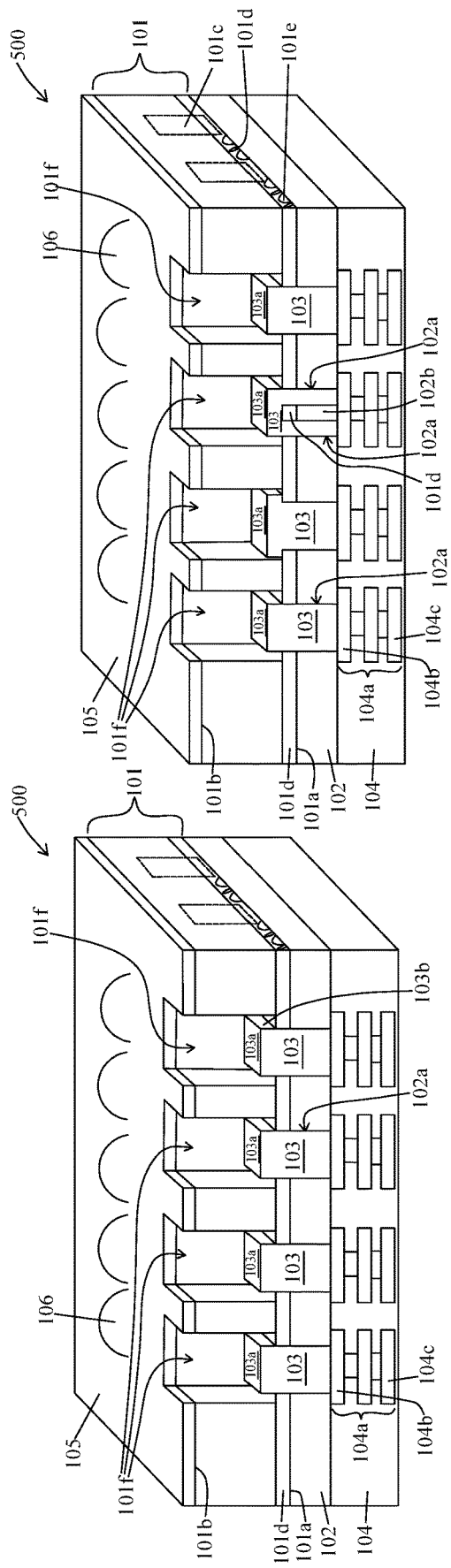
FIG. 5H is a perspective view of several semiconductor structures singulated from a semiconductive wafer in accordance with some embodiments of the present disclosure.

In operation 307, a semiconductor structure 500 is singulated along the scribe line region 109 (referring to FIG. 5A) as shown in FIG. 5H. In some embodiments, several semiconductor structures 500 are singulated from the semiconductive wafer 400 (referring to FIG. 5A) along several scribe line regions 109 (referring to FIG. 5A). Several pieces of the semiconductor structures 500 are formed simultaneously by the operations 301-306. The semiconductor structures 500 are neighbored with each other and are separated by the scribe line regions 109 (referring to FIG. 5A). In some embodiments, the semiconductor structures 500 are singulated by sawing along the scribe line regions 109. In some embodiments, the semiconductor structures 500 are singulated by a mechanical or laser blade. As a result, several pieces of the semiconductor structures 500 are produced. In some embodiments, the semiconductor structures 500 structurally same as each other.

In some embodiments, the semiconductor structure 500 has similar configuration as the semiconductor structure 100 in FIGS. 1-2 or the semiconductor structure 200 in FIGS. 3-4. In some embodiments, the semiconductor structure 500 is a semiconductor image sensing device.

In the present disclosure, an improved semiconductor structure (100 or 200) is disclosed. The semiconductor structure includes a semiconductive substrate 101, an interlayer dielectric (ILD) 102 disposed over a first side 101a of the semiconductive substrate 101, and a conductive pad 103 passing through the ILD 102 and surrounded by the semiconductive substrate 101. The semiconductive substrate 101 covering the conductive pad 103 is removed by photolithograph and etching operations, such that a portion of the conductive pad 103 is surrounded by the semiconductive substrate 101.

Since only the semiconductive substrate 101 covering the conductive pad 103 is removed, a roughness of a second side 101b of the semiconductive substrate 101 is mitigated. Therefore, a color filter 105 can be uniformly spread over the second side 101b of the semiconductive substrate 101 during spin coating operations, and the color filter 105 in a thin and uniform thickness can be formed over the second side 101b. The thin and uniform color filter 105 can improve the quantum efficiency (QE) of the semiconductor structure (100 or 200).

In some embodiments, a semiconductor structure is provided. The semiconductor structure includes a semiconductive substrate including a first side and a second side opposite to the first side, a radiation sensing device disposed in the semiconductive substrate, and an ILD disposed over the first side of the semiconductive substrate, and a conductive pad disposed within the semiconductive substrate and the ILD, and electrically connected to an interconnect structure. In some embodiments, a top surface of the conductive pad is between the first side of the semiconductive substrate and the second side of the semiconductive substrate.

In some embodiments, the top surface of the conductive pad is a concave or convex surface. In some embodiments, the radiation sensing device includes a third side near the first side of the semiconductive substrate and a fourth side near the second side of the semiconductive substrate, and the top surface of the conductive pad is between the third side and the fourth side. In some embodiments, the conductive pad is in contact with the ILD and is separated from the semiconductive substrate. In some embodiments, the conductive pad is in contact with the ILD and the semiconductive substrate. In some embodiments, a width of the conductive pad in the ILD is less than a width of the conductive pad in the semiconductive substrate. In some embodiments, the semiconductor structure further includes a color filter disposed over the second side of the semiconductive substrate. In some embodiments, the semiconductor structure further includes an intermetallic dielectric (IMD) disposed over the ILD, and the interconnect structure is disposed in the IMD.

In some embodiments, a semiconductor structure is provided. The semiconductor structure includes a semiconductive substrate including a first side and a second side opposite to the first side, a radiation sensing device disposed in the semiconductive substrate, an ILD disposed over the first side of the semiconductive substrate, and a conductive pad disposed in the semiconductive substrate and the ILD.

In some embodiments, the conductive pad is in contact with the ILD and is separated from the semiconductive substrate.

In some embodiments, the semiconductor structure further includes a color filter disposed over the second side of the semiconductive substrate. In some embodiments, the semiconductor structure further includes an interconnect structure disposed over the ILD and electrically connected to the conductive pad. In some embodiments, a top surface of the conductive pad is a concave or convex surface. In some embodiments, the semiconductive substrate further includes recessed portion extending from the seconds side to the first side, and the conductive pad is exposed through the recessed portion. In some embodiments, a width of the recessed portion is substantially greater than a width of the conductive pad.

In some embodiments, a semiconductor structure is provided. The semiconductor structure includes a semiconductive substrate including a first side and a second side opposite to the first side, a radiation sensing device disposed in the semiconductive substrate, an ILD disposed over the first side of the semiconductive substrate, and a conductive pad disposed within the semiconductive substrate and the ILD. In some embodiments, a portion of the ILD is disposed within the conductive pad.

In some embodiments, the semiconductor structure further includes a color filter disposed over the second side of the semiconductive substrate. In some embodiments, the semiconductor structure further includes an interconnect structure disposed over the ILD and electrically connected to the conductive pad. In some embodiments, a width of the conductive pad in the ILD is less than a width of the conductive pad in the semiconductive substrate. In some embodiments, the semiconductor structure further includes a STI disposed over the first side of the semiconductive substrate. In some embodiments, a portion of the STI is disposed within the conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:
1. A semiconductor structure, comprising:
a semiconductive substrate including a first side and a second side opposite to the first side;
a radiation sensing device disposed in the semiconductive substrate;
an isolation disposed in the semiconductive substrate and adjacent to the first side of the semiconductive substrate and the radiation sensing device;
an interlayer dielectric (ILD) disposed over the first side of the semiconductive substrate; and
a conductive pad disposed within the semiconductive substrate and the ILD, and electrically connected to an interconnect structure,
wherein a top surface of the conductive pad is between the first side of the semiconductive substrate and the second side of the semiconductive substrate, and sidewalls of the conductive pad is in direct contact with the ILD and the isolation.

2. The semiconductor structure of claim 1, wherein the top surface of the conductive pad is a concave or convex surface.

3. The semiconductor structure of claim 1, wherein the radiation sensing device includes a third side near the first side of the semiconductive substrate and a fourth side near the second side of the semiconductive substrate, and the top surface of the conductive pad is between the third side and the fourth side.

4. The semiconductor structure of claim 1, wherein the conductive pad is in contact with the ILD and is separated from the semiconductive substrate.

5. The semiconductor structure of claim 1, wherein the conductive pad is contact with the ILD and the semiconductive substrate.

6. The semiconductor structure of claim 5, wherein a width of the conductive pad in the ILD is less than a width of the conductive pad in the semiconductive substrate.

7. The semiconductor structure of claim 1, further comprising a color filter disposed over the second side of the semiconductive substrate.

8. The semiconductor structure of claim 1, further comprising an intermetallic dielectric (IMD) disposed over the ILD, wherein the interconnect structure is disposed in the IMD.

9. A semiconductor structure, comprising:
a semiconductive substrate including a first side and a second side opposite to the first side;
a radiation sensing device disposed in the semiconductive substrate;
a shallow trench isolation (STI) on disposed in the semiconductive substrate and adjacent to the first side of the semiconductive substrate and the radiation sensing device;
an interlayer dielectric (ILD) disposed over the first side of the semiconductive substrate and the interconnect structure;
a conductive pad disposed in the semiconductive substrate and the ILD and coupled to the interconnect structure, wherein sidewalls of the conductive pad are in direct contact with the ILD and the STI, and are separated from the semiconductive substrate.

10. The semiconductor structure of claim 9, further comprising a color filter disposed over the second side of the semiconductive substrate.

11. The semiconductor structure of claim 9, further comprising an interconnect structure disposed over the ILD and electrically connected to the conductive pad.

12. The semiconductor structure of claim 9, wherein a top surface of the conductive pad is a concave or convex surface.

13. The semiconductor structure of claim 9, wherein the semiconductive substrate comprises a recessed portion extending from the second side to the first side, and the conductive pad is exposed through the recessed portion.

14. The semiconductor structure of claim 13, wherein a width of the recessed portion is substantially greater than a width of the conductive pad.

15. A semiconductor structure, comprising:
a semiconductive substrate including a first side and a second side opposite to the first side;
a radiation sensing device disposed in the semiconductive substrate;
an interlayer dielectric (ILD) disposed over the first side of the semiconductive substrate; and
a conductive pad disposed in the semiconductive substrate and the ILD, wherein a portion of the ILD is disposed within the conductive pad.

16. The semiconductor structure of claim 15, further comprising a color filter disposed over the second side of the semiconductive substrate.

17. The semiconductor structure of claim 15, further comprising an interconnect structure disposed over the ILD and electrically connected to the conductive pad.

18. The semiconductor structure of claim 15, wherein a width of the conductive pad in the ILD is less than a width of the conductive pad in the semiconductive substrate.

19. The semiconductor structure of claim 15, further comprising a shallow trench isolation (STI) disposed over the first side of the semiconductive substrate.

20. The semiconductor structure of claim 19, wherein a portion of the STI is disposed within the conductive pad.

* * * * *